US009414441B2

(12) United States Patent
Takahara et al.

(10) Patent No.: US 9,414,441 B2
(45) Date of Patent: Aug. 9, 2016

(54) SHAFT-EQUIPPED HEATER UNIT AND METHOD FOR MANUFACTURING SHAFT-EQUIPPED HEATER UNIT

(75) Inventors: Gou Takahara, Kanagawa (JP); Toshihiro Tachikawa, Kanagawa (JP); Junichi Miyahara, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 282 days.

(21) Appl. No.: 14/119,991

(22) PCT Filed: May 29, 2012

(86) PCT No.: PCT/JP2012/063797
§ 371 (c)(1),
(2), (4) Date: Nov. 25, 2013

(87) PCT Pub. No.: WO2012/165440
PCT Pub. Date: Dec. 6, 2012

(65) Prior Publication Data
US 2014/0083995 A1  Mar. 27, 2014

(30) Foreign Application Priority Data
May 31, 2011 (JP) .................. 2011-122309

(51) Int. Cl.
*H05B 3/10* (2006.01)
*F27D 5/00* (2006.01)
*H01L 21/67* (2006.01)
*H01L 21/687* (2006.01)
*H05B 3/68* (2006.01)
*H05B 3/28* (2006.01)
*H05B 3/12* (2006.01)
*C23C 24/04* (2006.01)

(52) U.S. Cl.
CPC ........ *H05B 3/10* (2013.01); *C23C 24/04* (2013.01); *H01L 21/67103* (2013.01); *H01L 21/68792* (2013.01); *H05B 3/12* (2013.01); *H05B 3/283* (2013.01); *H05B 3/688* (2013.01); *H05B 2203/014* (2013.01)

(58) Field of Classification Search
None
See application file for complete search history.

(56) References Cited

U.S. PATENT DOCUMENTS

| 5,302,414 | A |   | 4/1994 | Alkhimov et al. |
| 7,060,945 | B2 | * | 6/2006 | Kondou ............... H05B 3/143 118/50.1 |
| 7,631,816 | B2 | * | 12/2009 | Jabado ................. C23C 24/04 118/308 |

(Continued)

FOREIGN PATENT DOCUMENTS

| CN | 102884224 A | 1/2013 |
| EP | 1349430 A2 | 10/2003 |

(Continued)

OTHER PUBLICATIONS

Supplementary European Search Report dated Nov. 27, 2014, issued for the European patent application No. 12792834.9.

(Continued)

*Primary Examiner* — Joseph M Pelham
(74) *Attorney, Agent, or Firm* — Locke Lord LLP

(57) ABSTRACT

A shaft-equipped heater unit includes a heater plate that heats an object to be heated placed thereon, and a shaft part that supports the heater plate, wherein the shaft part is formed by spraying material powder which constitutes the shaft part on the heater plate at a temperature lower than a melting point of the material powder by heated compressed gas.

10 Claims, 12 Drawing Sheets

(56) References Cited

U.S. PATENT DOCUMENTS

| | | | |
|---|---|---|---|
| 8,499,825 B2* | 8/2013 | Tsuzuki | C23C 24/04 165/80.2 |
| 9,070,487 B2* | 6/2015 | Kayamoto | C23C 24/04 |
| 2001/0029895 A1 | 10/2001 | Hanamachi et al. | |
| 2003/0062359 A1* | 4/2003 | Ho | H01L 21/67103 219/444.1 |
| 2003/0219576 A1* | 11/2003 | Elmoursi | H05K 3/102 482/210 |
| 2004/0188413 A1* | 9/2004 | Natsuhara | H01L 21/67103 219/444.1 |
| 2005/0082274 A1* | 4/2005 | Kondou | H05B 3/143 219/444.1 |
| 2005/0118450 A1 | 6/2005 | Fujii et al. | |
| 2005/0167421 A1* | 8/2005 | Futakuchiya | H01L 21/67126 219/520 |
| 2005/0211691 A1* | 9/2005 | Unno | H05B 3/143 219/216 |
| 2005/0236111 A1 | 10/2005 | Higashiura | |
| 2007/0036905 A1* | 2/2007 | Kramer | A61L 27/306 427/421.1 |
| 2008/0006618 A1 | 1/2008 | Futakuchiya et al. | |
| 2008/0237216 A1 | 10/2008 | Goto | |
| 2010/0073883 A1* | 3/2010 | Miyamato | C23C 24/04 361/709 |
| 2010/0230086 A1* | 9/2010 | Tsuzuki | C23C 24/04 165/185 |
| 2011/0052825 A1* | 3/2011 | Paxson | B05B 7/203 427/422 |
| 2013/0043635 A1* | 2/2013 | Kayamoto | C23C 16/4586 269/309 |
| 2013/0056187 A1* | 3/2013 | Kayamoto | C23C 24/04 165/168 |
| 2013/0072075 A1* | 3/2013 | Kayamoto | C23C 24/04 439/887 |
| 2013/0112383 A1* | 5/2013 | Hanamachi | C23C 16/45565 165/170 |
| 2013/0292152 A1* | 11/2013 | Kayamoto | C23C 24/04 174/68.2 |
| 2014/0069700 A1* | 3/2014 | Hirano | B32B 15/017 174/257 |
| 2015/0167864 A1* | 6/2015 | Mori | C23C 24/04 138/106 |

FOREIGN PATENT DOCUMENTS

| | | | | |
|---|---|---|---|---|
| EP | 2568062 A1 | * | 3/2013 | .......... C23C 16/4586 |
| JP | 2001-298020 A | | 10/2001 | |
| JP | 2003-288975 A | | 10/2003 | |
| JP | 2005-166368 A | | 6/2005 | |
| JP | 2005-191056 A | | 7/2005 | |
| JP | 2005-216759 A | | 8/2005 | |
| JP | 2008-016396 A | | 1/2008 | |
| JP | 2008016396 A | * | 1/2008 | |
| JP | 2008-527746 A | | 7/2008 | |
| JP | 2008-297615 A | | 12/2008 | |
| JP | 2009-127086 A | | 6/2009 | |
| JP | 2009146793 A | * | 7/2009 | |
| JP | 2009-176569 A | | 8/2009 | |
| JP | 2012-003906 A | | 1/2012 | |
| WO | WO-2006/076555 A1 | | 7/2006 | |

OTHER PUBLICATIONS

Office Action dated Jan. 7, 2015, issued for the corresponding Chinese patent application No. 201280025854.4 and English translation of cover page.

Notice of Allowance mailed Mar. 3, 2015, issued for the corresponding Japanese patent application No. 2011-122309 and English translation thereof.

Notice of Allowance dated Mar. 27, 2015, issued for the Korean patent application No. 10-2013-7031704.

International Search Report dated Jul. 31, 2012, issued for PCT/JP2012/063797.

* cited by examiner

SHAFT-EQUIPPED HEATER UNIT AND METHOD FOR MANUFACTURING SHAFT-EQUIPPED HEATER UNIT

FIELD

The present invention relates to a shaft-equipped heater unit for supporting and heating a semiconductor substrate and a method for manufacturing the shaft-equipped heater unit.

BACKGROUND

In a manufacturing process of a semiconductor substrate, such as at an annealing step, the semiconductor substrate is treated with heat in a vacuum chamber. In such a process, uniformly heating the semiconductor substrate to reduce the temperature distribution has a great influence on the yield; therefore, more precise temperature control is desired.

In the heat treatment of the semiconductor substrate, a shaft-equipped heater for supporting and heating the semiconductor substrate is used. The shaft-equipped heater is composed of a sheath heater-embedded heater plate on which the semiconductor substrate which is an object to be heated is placed and a shaft for supporting the heater plate. The shaft-equipped heater having this configuration has a problem that there is a decrease in temperature of a plate central part because a shaft central part is less subject to heat input due to a constraint on routing of a sheath heater wire, and also heat dissipation via the shaft is likely to occur.

Meanwhile, there has been proposed a technology to improve the temperature distribution of a heater plate in such a manner that the heater plate constituted of metal or metal alloy having high thermal conductivity and a shaft constituted of metal or metal alloy having lower thermal conductivity than material of the heater plate are joined by brazing or the like, thereby suppressing the heat conduction to the shaft.

Furthermore, there has been proposed a ceramic heater whose heater plate is a ceramic sintered body, wherein a shaft part formed of material having lower thermal conductivity than a heater plate part and the heater plate part are joined (see Patent Literature 1).

CITATION LIST

Patent Literature

Patent Literature 1: Japanese Laid-open Patent Publication No. 2005-166368

SUMMARY

Technical Problem

However, when different materials are joined by brazing or the like, there arises a problem that distortion due to a difference in thermal expansion between the different materials is accumulated because of high joining temperature, and it is difficult to improve the temperature distribution because of constraints on selectable materials in terms of a melting point of material and joining temperature, etc.

The present invention has been made in view of the above, and an object of the present invention is to provide a shaft-equipped heater unit and shaft-equipped heater unit manufacturing method capable of improving the temperature distribution of a heater and solving the distortion caused when different materials are joined and the interfacial delamination or crack.

Solution to Problem

To solve the problem described above and achieve the object, a shaft-equipped heater unit includes: a heater plate that heats an object to be heated placed thereon; and a shaft that supports the heater plate, wherein the shaft is formed by spraying material powder which constitutes the shaft on the heater plate at a temperature lower than a melting point of the material powder by heated compressed gas.

Moreover, in the above-described shaft-equipped heater unit according to the present invention, the heater plate is constituted of a metal or alloy having high thermal conductivity, and the shaft is constituted of a metal or alloy having lower thermal conductivity than the material constituting the heater plate.

Moreover, in the above-described shaft-equipped heater unit according to the present invention, the shaft comprises a heat-conduction suppressor that suppresses heat conduction from the heater plate to the shaft in a cylindrical body part thereof.

Moreover, in the above-described shaft-equipped heater unit according to the present invention, the heat-conduction suppressor is a heat insulation groove.

Moreover, in the above-described shaft-equipped heater unit according to the present invention, the heat-conduction suppressor is a cooling medium channel.

Moreover, in the above-described shaft-equipped heater unit according to the present invention, the shaft is formed of a first material identical to material constituting the heater plate and a second material having lower thermal conductivity than the material constituting the heater plate, and an end of the shaft on the side in contact with the heater plate is formed of the first material as a main component, and proportion of the first material constituting the shaft decreases gradually from the end on the side of the heater plate to another end.

Moreover, a method for manufacturing a shaft-equipped heater unit comprising a heater plate for heating an object to be heated placed thereon and a shaft for supporting the heater plate according to the present invention includes a shaft forming step of forming the shaft by spraying material powder, which constitutes the shaft, on the heater plate at a temperature lower than a melting point of the material powder by heated compressed gas.

Moreover, in the above-described method for manufacturing a shaft-equipped heater unit, the shaft forming step includes: a first spraying step of spraying material powder, which constitutes the shaft, on the heater plate at a temperature lower than a melting point of the material powder by heated compressed gas; a groove forming step of forming a heat insulation groove on the shaft formed at the first spraying step; and a second spraying step of, after the groove forming step, further spraying material powder which constitutes the shaft on the shaft on which the heat insulation groove has been formed at a temperature lower than a melting point of the material powder by heated compressed gas.

Moreover, in the above-described method for manufacturing a shaft-equipped heater unit, the shaft forming step includes: a first spraying step of spraying material powder, which constitutes the shaft, on the heater plate at a temperature lower than a melting point of the material powder by heated compressed gas; a pipe placing step of placing a cooling medium pipe in the shaft formed at the first spraying step; and a second spraying step of, after the pipe placing step, further spraying material powder which constitutes the shaft on the shaft in which the pipe has been placed at a temperature lower than a melting point of the material powder by heated compressed gas.

Moreover, in the above-described method for manufacturing a shaft-equipped heater unit, the shaft is formed of a first material identical to material constituting the heater plate and a second material having lower thermal conductivity than the material constituting the heater plate, and an end of the shaft on the side in contact with the heater plate is formed of the first material as a main component, and proportion of the first material constituting the shaft decreases gradually from the end on the side of the heater plate to another end.

Advantageous Effects of Invention

In a shaft-equipped heater unit and its manufacturing method according to the present invention, a shaft is formed by spraying material powder, which constitutes the shaft, directly on a heater plate at a temperature lower than a melting point of the material powder by heated compressed gas; therefore, there are achieved effects that material hard to be joined to the heater plate by brazing can be selected as material of the shaft, and delamination or a crack, etc. at the interface between the heater plate and the shaft due to thermal fatigue can be prevented effectively.

DESCRIPTION OF EMBODIMENTS

Embodiments of a shaft-equipped heater unit and method for manufacturing the shaft-equipped heater unit according to the present invention will be explained in detail below on the basis of accompanying drawings. Incidentally, the present invention is not limited to these embodiments, and various modifications can be made without departing from the scope of the present invention.

First Embodiment

Figure 1:
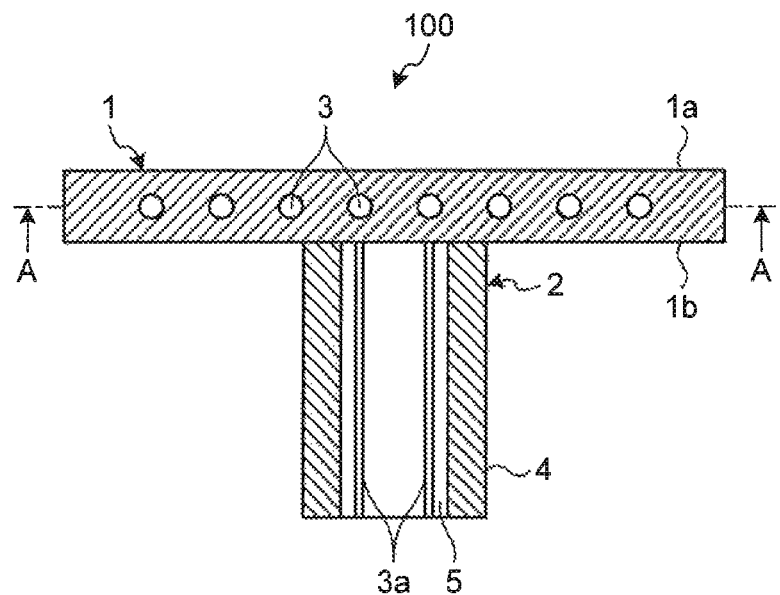
FIG. 1 is a cross-sectional view showing a configuration of a shaft-equipped heater unit according to a first embodiment of the present invention.

FIG. 1 is a cross-sectional view showing a configuration of a shaft-equipped heater unit 100 according to a first embodiment of the present invention. The shaft-equipped heater unit 100 includes a roughly-discoid heater plate 1 that an object to be heated is placed on a placing surface 1a thereof and a shaft part 2 that is joined to the center of a rear surface 1b of the heater plate 1 and supports the heater plate 1. In the first embodiment, the discoid heater plate 1 is used; however, the heater plate 1 is not limited to this shape, and can be formed into any shape taking into account the shape of the heated object, etc.; for example, the heater plate 1 can be formed into a rectangular shape.

Figure 2:
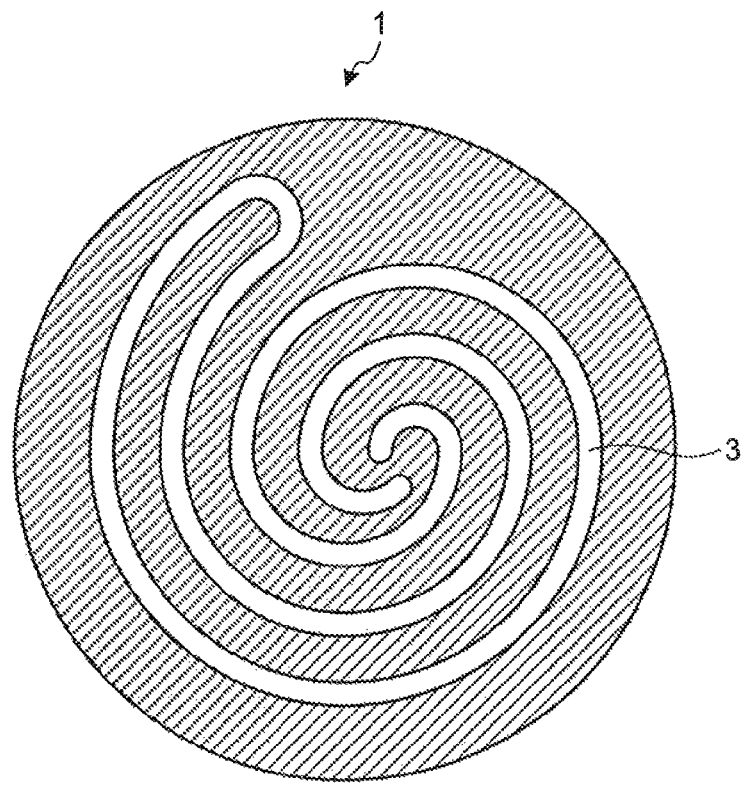
FIG. 2 is a cross-sectional view of the shaft-equipped heater unit along a line A-A shown in FIG. 1.

FIG. 2 is a cross-sectional view of the shaft-equipped heater unit 100 along a line A-A shown in FIG. 1. As shown in FIG. 2, a spiral-shaped sheath heater 3 is installed in the heater plate 1. The sheath heater 3 includes a resistance heating element, such as a nichrome wire, and an insulator formed by solidification of powder such as magnesia powder on the outer periphery of the resistance heating element, and supplies electric power to the resistance heating element to generate heat. As a configuration of the sheath heater 3, besides the spiral shape shown in FIG. 2, any desired shape can be adopted.

The heater plate 1 is formed of a metal or alloy having high thermal conductivity, and material of the heater plate 1 is arbitrarily selected on the basis of an operating temperature range of the shaft-equipped heater unit 100. As material of the heater plate 1, for example, aluminum or aluminum alloy (thermal conductivity: 100 to 240 W/m·K) is preferably used; however, material of the heater plate 1 is not limited to this, and can be selected from iron or iron alloy (thermal conductivity: 10 to 80 W/m·K), copper or copper alloy (thermal conductivity: 100 to 400 W/m·K), nickel or nickel alloy (thermal conductivity: 5 to 100 W/m·K), titanium or titanium alloy (thermal conductivity: 5 to 30 W/m·K), indium (thermal conductivity: 82 W/m·K at normal temperature), lead (thermal conductivity: 35 W/m·K at normal temperature), magnesium (thermal conductivity: 156 W/m·K at normal temperature), tin (thermal conductivity: 67 W/m·K at normal temperature), silver (thermal conductivity: 420 W/m·K at normal temperature), and zinc (thermal conductivity: 116 W/m·K at normal temperature), etc.

The shaft part 2 is composed of a cylindrical shaft body part 4 that supports the heater plate 1 and has a hollow portion 5 into which a power supply line 3a for the supply of power from an external power source is inserted. The shaft part 2 is laminated and formed on the rear surface 1b of the heater plate 1 by a cold spray device to be described later.

Material which constitutes the shaft part 2 is selected from metals or alloys that have lower thermal conductivity than material constituting the heater plate 1. The shaft part 2 is formed of a metal or alloy having lower thermal conductivity than material constituting the heater plate 1, thereby the heat conduction from the heater plate 1 to the shaft part 2 can be suppressed. As material of the shaft part 2, if the heater plate 1 is constituted of aluminum or aluminum alloy (thermal conductivity: 100 to 240 W/m·K), a metal or alloy having lower thermal conductivity than aluminum or aluminum alloy, such as stainless steel (thermal conductivity: 16 to 20 W/m·K), is preferably used.

Figure 3:
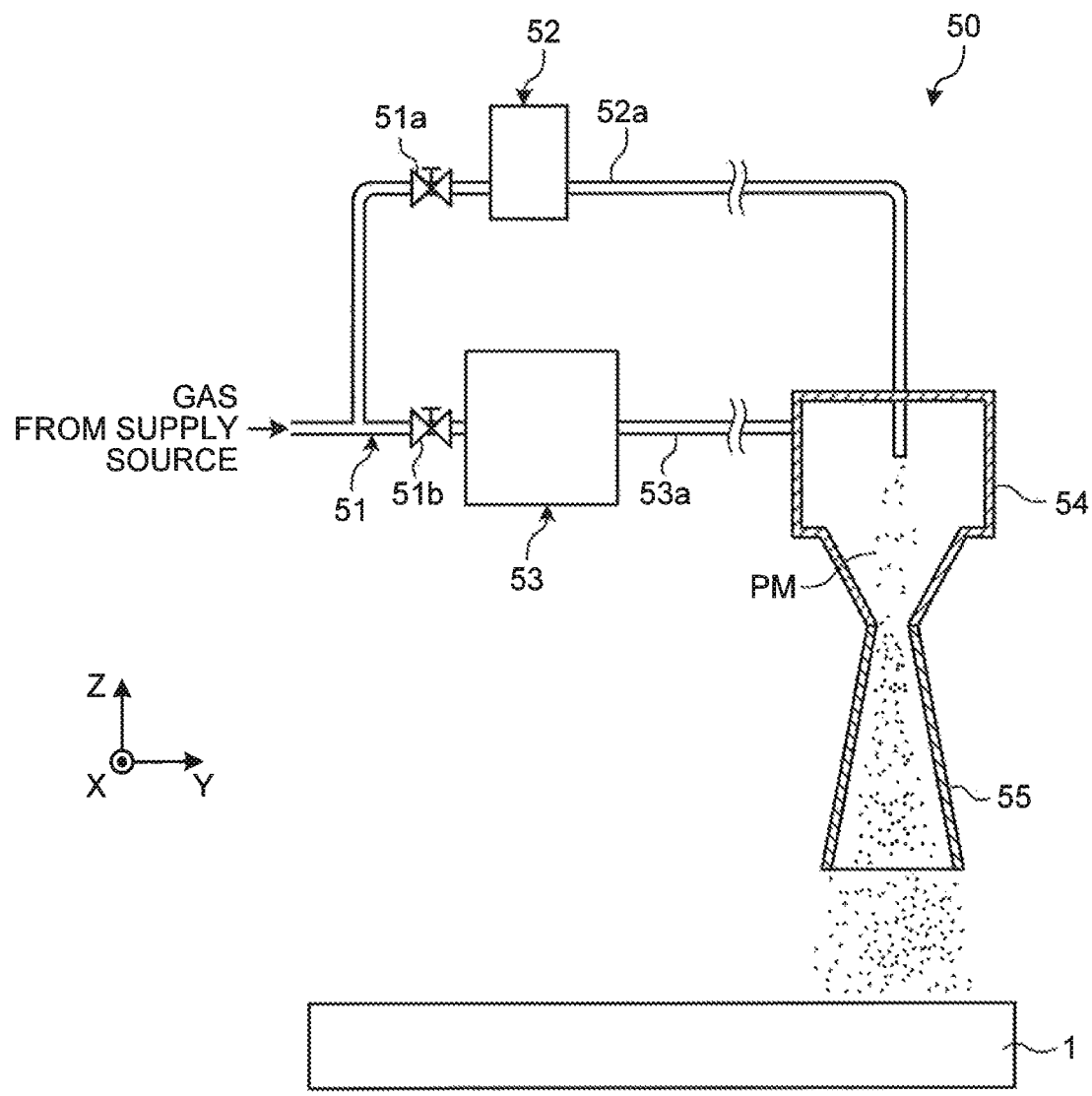
FIG. 3 is an explanatory diagram showing an overview of a cold spray device used in the manufacture of the shaft-equipped heater unit according to the first embodiment of the present invention.

Subsequently, a method for manufacturing the shaft-equipped heater unit 100 according to the first embodiment is explained with reference to FIG. 3. FIG. 3 is an explanatory diagram showing an overview of a cold spray device 50 used in the manufacture of the shaft-equipped heater unit according to the first embodiment of the present invention.

As shown in FIG. 3, the cold spray device 50 includes a gas introduction pipe 51 through which inert gas, such as helium (He) and nitrogen (N$_2$), or gas (working gas), such as air, is introduced from a gas supply source, a powder supply unit 52 that supplies material powder PM which is raw material, a heater 53 that heats the gas introduced through the gas introduction pipe 51 to a desired temperature, a chamber 54 in which the material powder PM is mixed with the gas so as to be sprayed, and a nozzle 55 that sprays the material powder PM. The material powder PM here is powder of the material which constitutes the shaft part 2.

The powder supply unit 52 contains fine material powder PM (for example, with a particle diameter of about 10 to 100 μmin). A desired flow rate of gas is introduced into the powder supply unit 52 by operating a valve 51a installed in the gas introduction pipe 51, thereby the material powder PM is supplied into the chamber 54 through a powder supply pipe 52a together with the gas.

The heater 53 heats the introduced gas to, for example, about 50° C. to 700° C. An upper limit of this heating temperature shall be less than a melting point of material because solid-phase material powder PM is sprayed on the rear surface 1b of the heater plate 1. More preferably, the upper temperature limit shall be kept to a Celsius temperature of about 60% or less of the melting point. This is because the higher the heating temperature is, the more likely the material powder PM is to be oxidized.

The gas heated by the heater 53 is introduced into the chamber 54 through a gas pipe 53a. Incidentally, a flow rate of the gas introduced into the chamber 54 is adjusted by a valve 51b installed in the gas introduction pipe 51. The heated compressed gas is made into a supersonic flow (about 340 m/s or more) by the convergent-divergent nozzle 55, and the material powder PM supplied into the chamber 54 is accelerated by being thrown into the supersonic gas flow, and the material powder PM remaining the solid phase collides with base material, i.e., the heater plate 1 in the first embodiment at high speed, thereby a film is formed.

As shown in FIG. 3, the material powder PM is deposited by moving the nozzle 55 in a direction of arrow X and a direction of arrow Y, thereby the shaft body part 4 is formed on the rear surface 1b of the heater plate 1. Incidentally, any device capable of forming a film by making solid-phase material powder PM collide with base material can be used in the manufacture of the shaft-equipped heater unit 100 according to the first embodiment, and it is not limited to the cold spray device 50 shown in FIG. 3.

After the desired-shaped shaft part 2 has been formed on the rear surface 1b of the heater plate 1 by the above-described cold spray device 50, the material powder PM attached to an unwanted part is removed, and the end and side faces, etc. of the shaft part 2 are smoothed by polishing, thereby the shaft-equipped heater unit 100 is manufactured.

The material powder PM collides with the surface of a lower layer (the rear surface 1b of the heater plate 1 or the shaft body part 4 deposited till that time) at high speed and bites into the lower layer, and also is deformed and attached to the lower layer, so that the shaft part 2 manufactured in this way is a metal film laminate adhered strongly to the lower layer. The shaft-equipped heater unit 100 according to the first embodiment can observe a phenomenon where the metal film bites into the rear surface 1b (called an anchor effect) at the interface between the shaft body part 4 and the rear surface 1b of the heater plate 1, and the shaft body part 4 is closely joined to the heater plate 1 formed of a different kind of metal without leaving any gap between them.

The shaft part 2 is firmly fixed to the rear surface 1b of the heater plate 1, so that the shaft-equipped heater unit 100 according to the first embodiment can suppress the occurrence of delamination or a crack in between the heater plate 1 and the shaft part 2 that may occur when the heater plate 1 and the shaft part 2 formed of different material (such as material having low thermal conductivity) from the heater plate 1 are joined, for example, by brazing. Furthermore, when the heater plate 1 is aluminum or aluminum alloy, it used to be difficult to join the shaft part 2 formed of stainless steel to the heater plate 1 by brazing; however, according to the cold spray device 50, even when difficult-to-braze material is selected as raw material of the shaft part 2, it can perform the joining of the shaft part 2 to the heater plate 1 firmly, and therefore it is possible to broaden options for material of the shaft part 2.

Moreover, when the heater plate 1 is formed of aluminum or aluminum alloy, and the shaft part 2 is formed of, for example, stainless steel having lower thermal conductivity than aluminum or aluminum alloy, the heat conduction from the heater plate 1 to the shaft part 2 is suppressed, and the temperature distribution of the heater plate 1 can be improved. This allows uniform heating of an object to be heated, and semiconductor manufacturing equipment using the shaft-equipped heater unit 100 can manufacture stable-quality semiconductor substrates.

As described above, the shaft part 2 is formed by spraying material powder PM, which constitutes the shaft part 2, on the rear surface 1b of the heater plate 1 at a temperature lower than a melting point of the material powder PM by heated compressed gas, and therefore the shaft-equipped heater unit 100 according to the first embodiment can suppress the accumulation of distortion due to a difference in thermal expansion caused by brazing of different materials and the occurrence of interfacial delamination or crack, etc. due to long-term use. Furthermore, a metal or alloy having lower thermal conductivity than material of the heater plate 1 is selected as material which constitutes the shaft part 2, thereby the heat conduction from the heater plate 1 to the shaft part 2 is suppressed, and the temperature distribution of the heater plate 1 can be improved.

Second Embodiment

Figure 4:
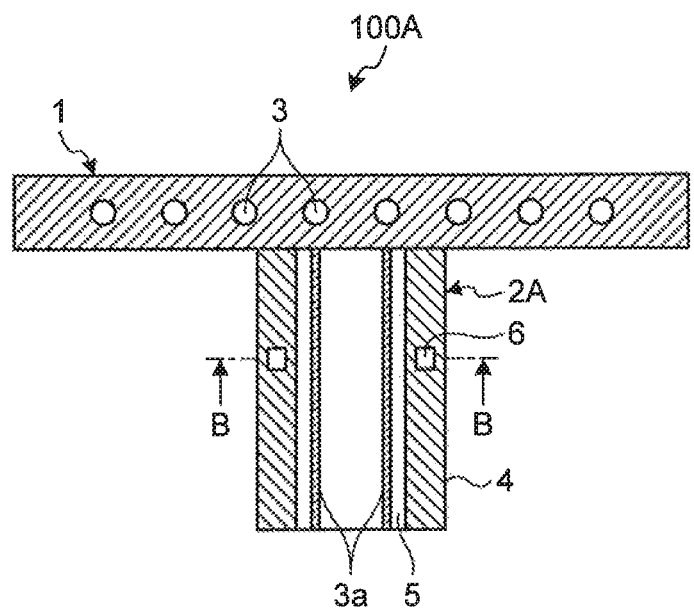
FIG. 4 is a cross-sectional view showing a configuration of a shaft-equipped heater unit according to a second embodiment of the present invention.
Figure 5:
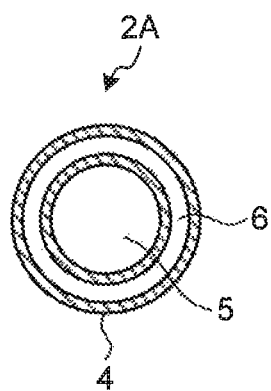
FIG. 5 is a cross-sectional view of the shaft-equipped heater unit along a line B-B shown in FIG. 4.
Figure 6:
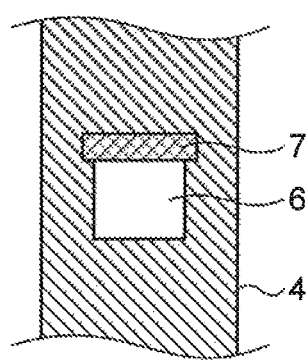
FIG. 6 is an enlarged cross-sectional view of a heat insulation groove and its surrounding part of the shaft-equipped heater unit shown in FIG. 4.

A shaft-equipped heater unit according to a second embodiment is explained with reference to drawings. FIG. 4 is a cross-sectional view showing a configuration of a shaft-equipped heater unit 100A according to the second embodiment of the present invention. FIG. 5 is a cross-sectional view of the shaft-equipped heater unit 100A along a line B-B shown in FIG. 4. FIG. 6 is an enlarged cross-sectional view of a heat insulation groove 6 and its surrounding part of the shaft-equipped heater unit 100A shown in FIG. 4. The shaft-equipped heater unit 100A according to the second embodiment has the heat insulation groove 6 in the shaft body part 4.

The heat insulation groove 6 is a groove that is rectangular in cross-section and is formed roughly in the center of the cylindrical shaft body part 4, and is formed so as to completely surround the section of the shaft body part 4 as shown in FIG. 5. Furthermore, the shaft-equipped heater unit 100A has a structure where the heat insulation groove 6 is covered with a cover part 7 as shown in FIG. 6. The cover part 7 is shaped like a disc having a diameter larger than an outer diameter of the heat insulation groove 6. The cross-sectional shape of the heat insulation groove 6 is not limited to a rectangular shape, and can be a round shape, etc. as long as the heat insulation groove 6 has a structure where air (thermal conductivity: 0.02 W/m·K) as heat insulating material is present in the heat insulation groove 6.

Subsequently, a manufacturing process of a shaft part 2A having the heat insulation groove 6 is explained with reference to FIGS. 7A to 7D.

Figure 7A:
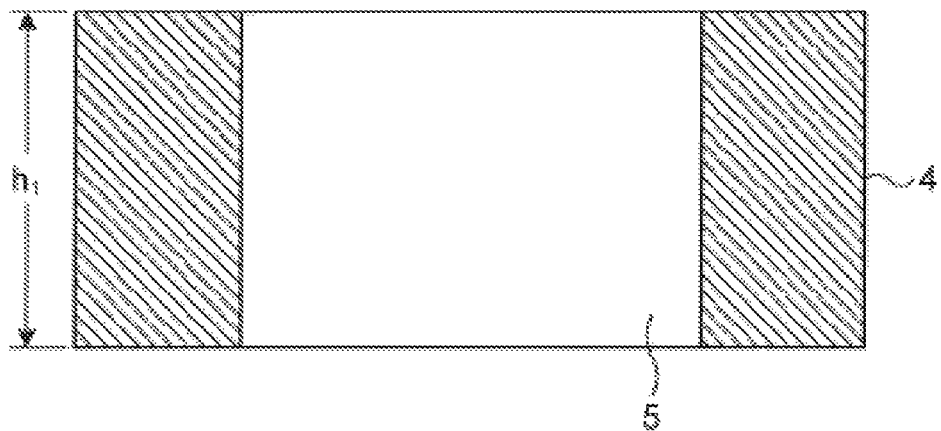
FIG. 7A is a cross-sectional view showing a manufacturing process of the shaft-equipped heater unit according to the second embodiment of the present invention.

First, as shown in FIG. 7A, by using the cold spray device 50, material powder PM, which constitutes the shaft body part 4, is sprayed on the rear surface 1b of the heater plate 1 at a temperature lower than a melting point of the material powder PM by heated compressed gas, thereby a metal film is deposited and formed. When the height of the metal film has reached a predetermined height ($h_1$), the deposition of the metal film is terminated for the moment.

Figure 7B:
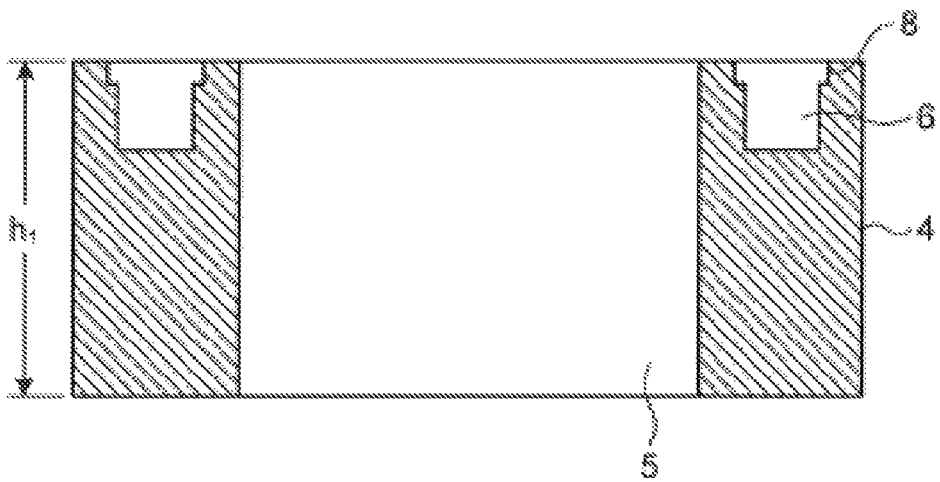
FIG. 7B is a cross-sectional view showing the manufacturing process of the shaft-equipped heater unit according to the second embodiment of the present invention.

After the end face of the shaft body part 4 has been smoothed, the heat insulation groove 6 is formed by cutting work or the like as shown in FIG. 7B. After that, a cover support part 8 on which the cover part 7 is placed is formed by further cutting off the periphery of an opening of the heat insulation groove 6.

Figure 7C:
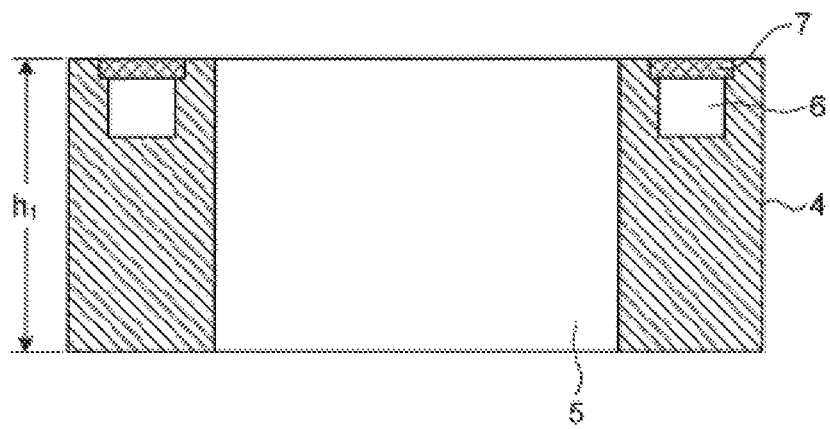
FIG. 7C is a cross-sectional view showing the manufacturing process of the shaft-equipped heater unit according to the second embodiment of the present invention.
Figure 7D:
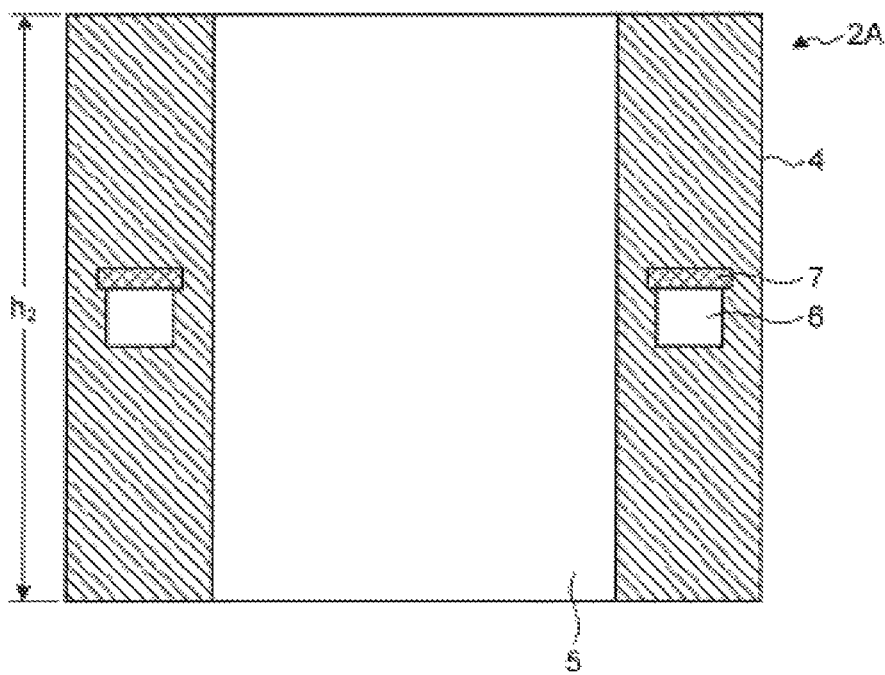
FIG. 7D is a cross-sectional view showing the manufacturing process of the shaft-equipped heater unit according to the second embodiment of the present invention.

After that, the cover part 7 is placed on the cover support part 8 as shown in FIG. 7C, and by using the cold spray device 50 again, material powder PM is sprayed on the shaft body part 4 so as to cover the cover part 7 at the temperature lower than the melting point of the material powder PM by heated compressed gas, thereby the metal film is further deposited and formed until the height of the metal film has reached a predetermined height ($h_2$). After the completion of the deposition of the metal film, the end and side faces, etc. of the shaft part 2A are smoothed by polishing, thereby the shaft-equipped heater unit 100A is manufactured.

Incidentally, the diameter of the cover part 7 shall be larger than an outer diameter of the opening of the heat insulation groove 6 so that the material powder PM does not go into the heat insulation groove 6, and also shall be smaller than the diameter of the cover support part 8 so that the cover part 7 is supported by the cover support part 8. Furthermore, the height of the cover part 7 does not have to be the same height as the cover support part 8 as long as the cover part 7 can seal air used as heat insulating material in the heat insulation groove 6.

As described above, the shaft part 2A is formed on the rear surface 1b of the heater plate 1 by the cold spray device 50, and therefore the shaft-equipped heater unit 100A according to the second embodiment can suppress the accumulation of distortion due to a difference in thermal expansion between the heater plate 1 and the shaft part 2A and the occurrence of delamination or a crack that may occur when the heater plate 1 and the shaft part 2A formed of different material (such as material having low thermal conductivity) from the heater plate 1 are joined, for example, by brazing. Furthermore, even when the shaft part 2A is formed of the same material as the heater plate 1, for example, aluminum or aluminum alloy, the heat conduction from the heater plate 1 to the shaft part 2A can be suppressed by the heat insulating material (air) sealed in the heat insulation groove 6, and the temperature distribution of the heater plate 1 can be improved. Moreover, when material having lower thermal conductivity than material of the heater plate 1 is selected as material which constitutes the shaft part 2A, the heat conduction from the heater plate 1 to the shaft part 2A can be further reduced. And further, an amount of heat conducted to an end of the shaft part 2A on the side not in contact with the heater plate 1 is reduced, and therefore it is possible to prevent deterioration of an O-ring used in the installation of the shaft-equipped heater unit 100A.

Incidentally, the shaft-equipped heater unit 100A according to the second embodiment has the structure where the cover support part 8 is provided on the periphery of the opening of the heat insulation groove 6, and the cover part 7 is placed on the cover support part 8; alternatively, air can be sealed in the heat insulation groove 6 in such a manner that the heat insulation groove 6 is covered with the cover part 7 without forming the cover support part 8 and the shaft body part 4 is further formed on the cover part 7 by the cold spray device 50.

Third Embodiment

Figure 8:
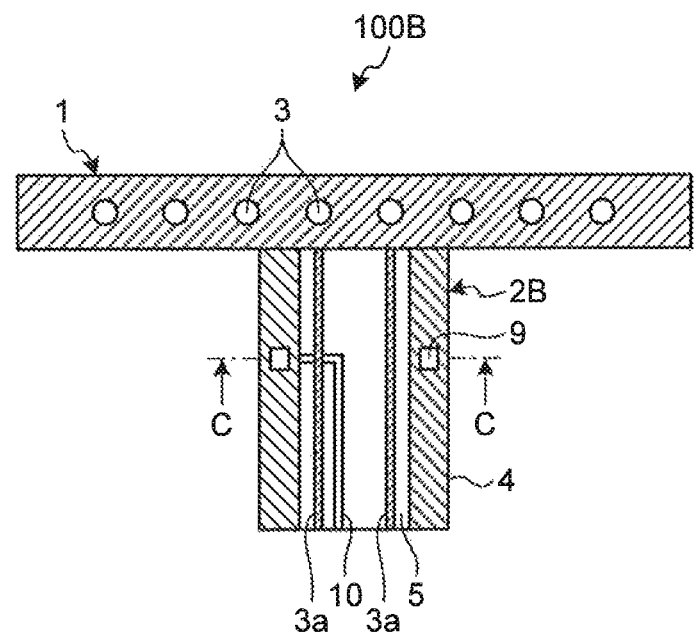
FIG. 8 is a cross-sectional view showing a configuration of a shaft-equipped heater unit according to a third embodiment of the present invention.
Figure 9:
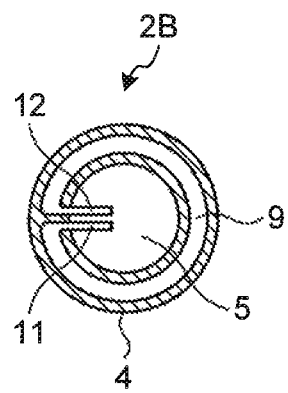
FIG. 9 is a cross-sectional view of the shaft-equipped heater unit along a line C-C shown in FIG. 8.
Figure 10:
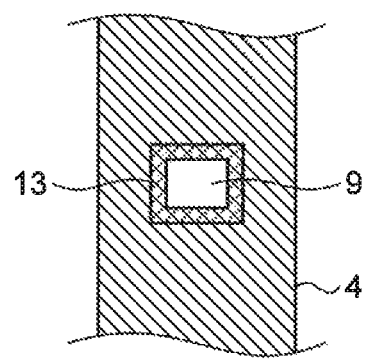
FIG. 10 is an enlarged cross-sectional view of a cooling medium channel and its surrounding part of the shaft-equipped heater unit shown in FIG. 8.

A shaft-equipped heater unit according to a third embodiment is explained with reference to drawings. FIG. 8 is a cross-sectional view showing a configuration of a shaft-equipped heater unit 100B according to the third embodiment of the present invention. FIG. 9 is a cross-sectional view of the shaft-equipped heater unit 100B along a line C-C shown in FIG. 8. FIG. 10 is an enlarged cross-sectional view of a cooling medium channel and its surrounding part of the shaft-equipped heater unit 100B shown in FIG. 8. The shaft-equipped heater unit 100B according to the third embodiment has a cooling medium channel 9 in the shaft body part 4.

The cooling medium channel 9 is a flow channel that is rectangular in cross-section and is formed roughly in the center of the cylindrical shaft body part 4, and is formed so as to completely surround the section of the shaft body part 4 as shown in FIG. 9. As shown in FIG. 10, the cooling medium channel 9 is formed of a pipe 13, and the cross-sectional shape of the cooling medium channel 9 can be formed into a round shape and a triangular shape, etc. by changing the cross-sectional shape of the pipe 13. Material constituting the pipe 13 is selected according to the kind of a cooling medium; when city water is used as a cooling medium, corrosion-resistant material, such as copper, copper alloy, stainless steel, nickel, nickel alloy, tantalum, tantalum alloy, titanium, and titanium alloy, is used. Incidentally, the medium is not limited to liquid, and can be gas.

The shaft-equipped heater unit 100B has a structure where a cooling medium is introduced into the cooling medium channel 9 from an inflow port 11 connected to a cooling pipe 10, and heat is absorbed from the shaft body part 4 by passage of the cooling medium through the cooling medium channel 9, and the cooling medium flows out from an outflow port 12 connected to a cooling pipe (not shown).

Subsequently, a manufacturing process of a shaft part 2B having the cooling medium channel 9 is explained with reference to FIGS. 11A to 11C.

Figure 11A:
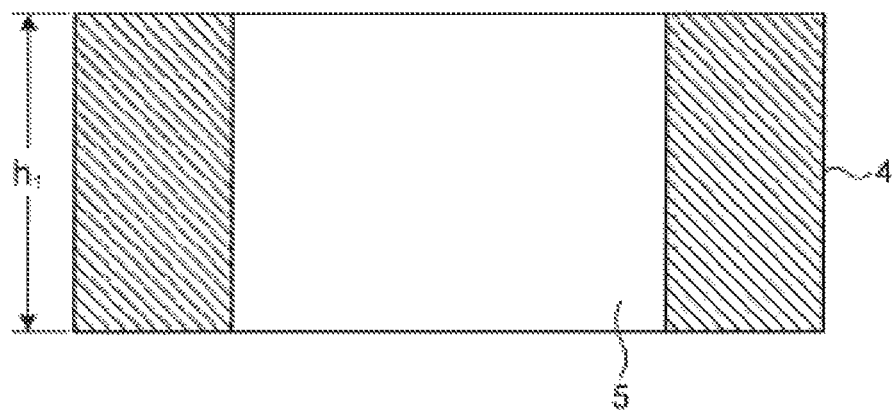
FIG. 11A is a cross-sectional view showing a manufacturing process of the shaft-equipped heater unit according to the third embodiment of the present invention.

First, as shown in FIG. 11A, by using the cold spray device 50, material powder PM, which constitutes the shaft body part 4, is sprayed on the rear surface 1b of the heater plate 1 at a temperature lower than a melting point of the material powder PM by heated compressed gas, thereby a metal film is deposited and formed. When the height of the metal film has reached a predetermined height ($h_1$), the deposition of the metal film is terminated for the moment.

Figure 11B:
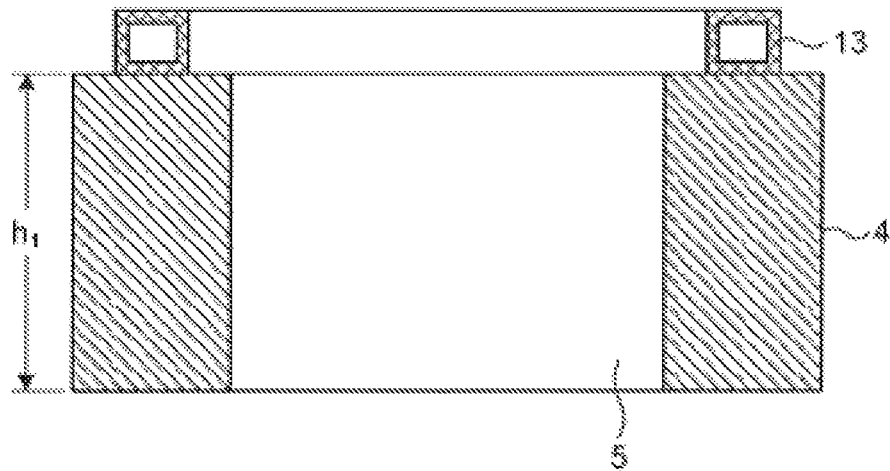
FIG. 11B is a cross-sectional view showing the manufacturing process of the shaft-equipped heater unit according to the third embodiment of the present invention.

After the end face of the shaft body part 4 has been smoothed, the pipe 13 is placed on the end face of the shaft body part 4 as shown in FIG. 11B.

Figure 11C:
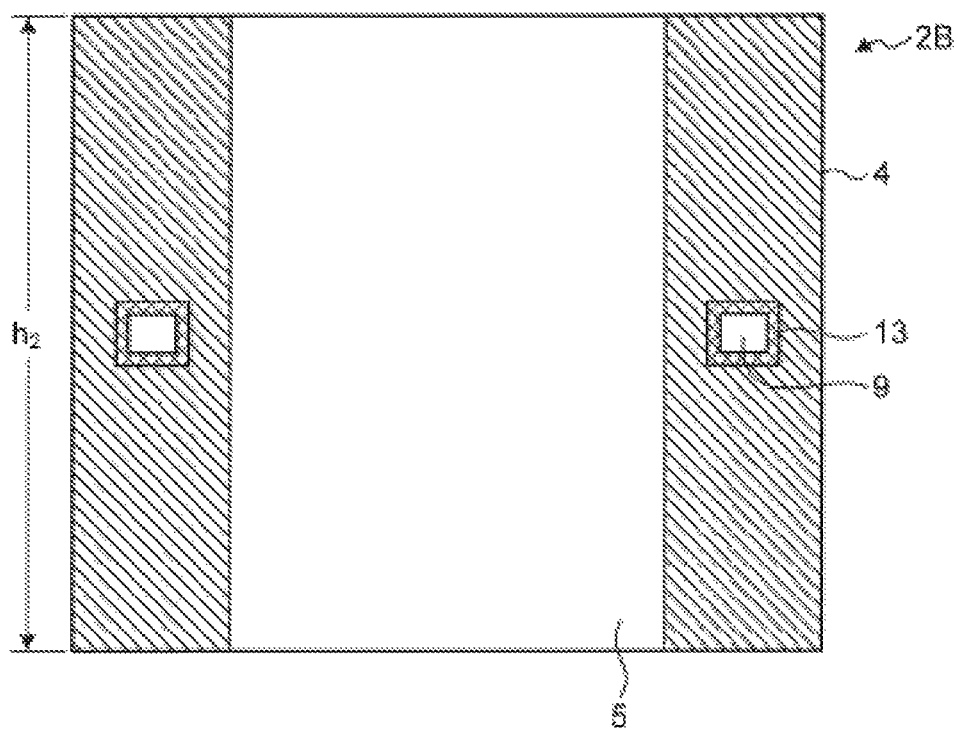
FIG. 11C is a cross-sectional view showing the manufacturing process of the shaft-equipped heater unit according to the third embodiment of the present invention.

After that, material powder PM is sprayed on the shaft body part 4 from above the pipe 13 at the temperature lower than the melting point of the material powder PM by heated compressed gas, thereby the metal film is further deposited and formed until the height of the metal film has reached a predetermined height ($h_2$) as shown in FIG. 11C. After the completion of the deposition of the metal film, the end and side faces, etc. of the shaft part 2B are smoothed by polishing, thereby the shaft-equipped heater unit 100B is manufactured.

As described above, the shaft part 2B is formed on the rear surface 1b of the heater plate 1 by the cold spray device 50, and therefore the shaft-equipped heater unit 100B according to the third embodiment can suppress the accumulation of distortion due to a difference in thermal expansion between the heater plate 1 and the shaft part 2B and the occurrence of delamination or a crack that may occur when the heater plate 1 and the shaft part 2B formed of different material (such as material having low thermal conductivity) from the heater plate 1 are joined, for example, by brazing. Furthermore, even when the shaft part 2B is formed of the same material as the heater plate 1, for example, aluminum or aluminum alloy, the heat conduction from the heater plate 1 to the shaft part 2B can be suppressed by a cooling medium introduced into the cooling medium channel 9, and the temperature distribution of the heater plate 1 can be improved. Moreover, when material having lower thermal conductivity than material of the heater plate 1 is selected as material which constitutes the shaft part 2B, the heat conduction from the heater plate 1 to the shaft part 2B can be further reduced. And further, an amount of heat conducted to an end of the shaft part 2B on the side not in contact with the heater plate 1 is reduced, and therefore it is possible to prevent early deterioration of an O-ring used in the installation of the shaft-equipped heater unit 100B.

Fourth Embodiment

Figure 12:
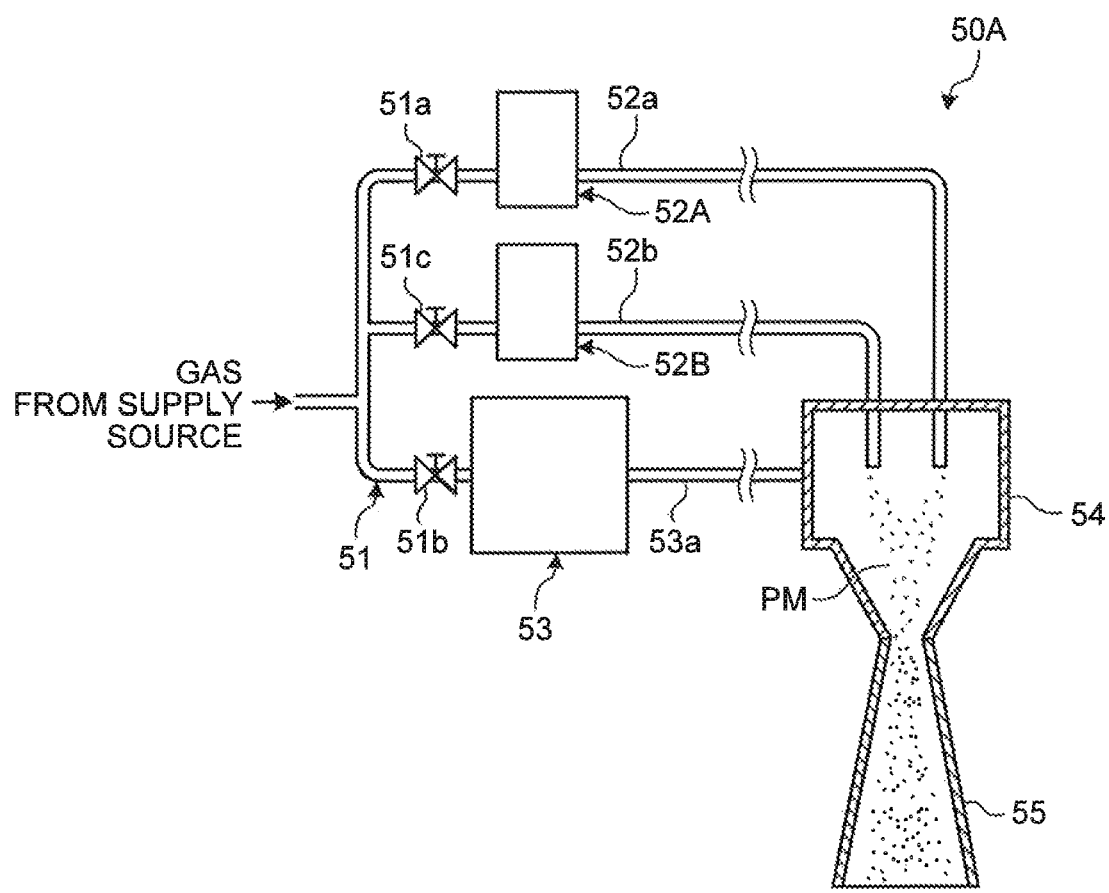
FIG. 12 is an explanatory diagram showing an overview of a cold spray device used in the manufacture of a shaft-equipped heater unit according to a fourth embodiment of the present invention.
Figure 13:
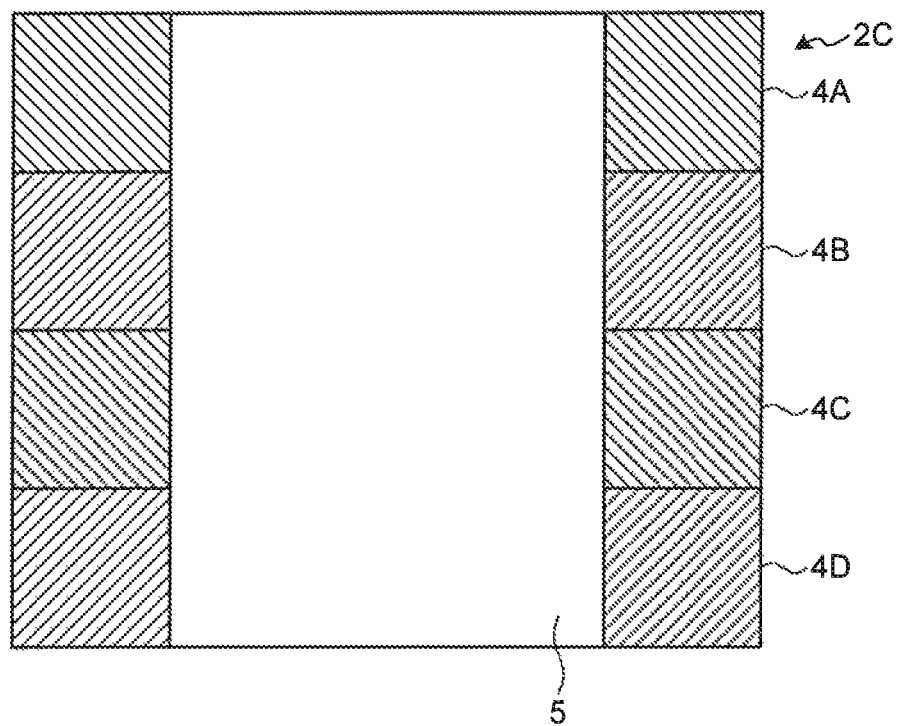
FIG. 13 is an enlarged cross-sectional view of a shaft part of the shaft-equipped heater unit according to the fourth embodiment of the present invention.

A shaft-equipped heater unit according to a fourth embodiment is explained with reference to drawings. FIG. 12 is an explanatory diagram showing an overview of a cold spray device 50A used in the manufacture of the shaft-equipped heater unit according to the fourth embodiment of the present invention. FIG. 13 is an enlarged cross-sectional view of a shaft part 2C of the shaft-equipped heater unit according to the fourth embodiment of the present invention.

The shaft part 2C according to the fourth embodiment is formed of a first material identical to material constituting the heater plate 1 and a second material having lower thermal conductivity than the material constituting the heater plate 1. For example, there is explained a case where the material constituting the heater plate 1 is aluminum (thermal conductivity: 100 to 240 W/m·K), and stainless steel (thermal conductivity: 16 to 20 W/m·K) is used as the material having lower thermal conductivity than the material constituting the heater plate 1.

As shown in FIG. 12, the cold spray device 50A for manufacturing the shaft-equipped heater unit according to the fourth embodiment includes a first powder supply unit 52A for storing and supplying aluminum powder used as the first material which is raw material and a second powder supply unit 52B for storing and supplying stainless steel powder used as the second material.

Desired flow rates of gases are introduced into the first powder supply unit 52A and the second powder supply unit 52B by operating valves 51a and 51c installed in the gas introduction pipe 51, thereby the first material powder and the second material powder are supplied into the chamber 54 through powder supply pipes 52a and 52b together with the gases, respectively.

In the fourth embodiment, the ratio between materials which constitute the shaft part 2C is changed by using the cold spray device 50A. As shown in FIG. 13, the shaft part 2C is composed of a shaft body part 4A, a shaft body part 4B, a shaft body part 4C, and a shaft body part 4D. The shaft body part 4A is on the side of the heater plate 1, and the shaft body part 4D is on the side of a housing of the device.

In the shaft part 2C, the shaft body part 4A on the side in contact with the heater plate 1 is constituted of only aluminum which is the first material; the shaft body part 4B is constituted of aluminum, which is the first material, and stainless steel, which is the second material, at a ratio of 3:7; the shaft body part 4C is constituted of aluminum, which is the first material, and stainless steel, which is the second material, at a ratio of 7:3; and the shaft body part 4D is constituted of only stainless steel which is the second material. The above-described respective ratios of the first material to the second material for the shaft body parts 4A, 4B, 4C, and 4D are illustrative only, and can be changed as long as the proportion of the first material constituting the shaft part 2C decreases gradually from one end on the side of the heater plate 1 to the other end.

In the manufacture of the shaft part 2C, first, the valve 51a is operated so that only aluminum powder which is the first material is supplied into the chamber 54, and the aluminum powder is sprayed on the rear surface 1b of the heater plate 1 at a temperature lower than a melting point of material powder PM by heated compressed gas, thereby the shaft body part 4A is deposited and formed. After the height of a metal film has reached a predetermined height, the valves 51a and 51c are operated so that aluminum which is the first material and stainless steel which is the second material are supplied at a ratio of 3:7, and material powder PM is sprayed at a temperature lower than a melting point of the material powder PM by heated compressed gas, thereby the shaft body part 4B is deposited and formed.

After that, the valves 51a and 51c are operated so that aluminum which is the first material and stainless steel which is the second material are supplied at a ratio of 7:3, and the shaft body part 4C is deposited and formed, and then, last, the valve 51c is operated so that only stainless steel powder which is the second material is supplied into the chamber 54, and the shaft body part 4D is deposited and formed.

The shaft part 2C is formed on the rear surface 1b of the heater plate 1 by using, first, the first material identical to material constituting the heater plate 1 as a main component, and therefore the shaft-equipped heater unit according to the fourth embodiment can suppress the accumulation of distortion due to a difference in thermal expansion between the heater plate 1 and the shaft part 2C and the occurrence of interfacial delamination or crack, etc. Furthermore, the second material having lower thermal conductivity than the material of the heater plate 1 is selected as one of materials which constitute the shaft part 2C, and the proportion of the second material increases in stages from one end on the side of the heater plate 1 to the other end, and therefore the heat conduction from the heater plate 1 to the shaft part 2C can be reduced. Moreover, an end of the shaft part 2C on the side not in contact with the heater plate 1 is formed of material having low thermal conductivity, and therefore an amount of heat conducted to an end of the shaft part 2C on the side of the shaft body part 4D can be reduced, and it is possible to prevent early deterioration of an O-ring used in the installation in the housing that contains the shaft-equipped heater unit.

Incidentally, in the fourth embodiment, there is explained the case where the ratio between materials constituting the shaft part 2C is changed in stages; alternatively, a shaft part can be formed by gradually changing the ratio between the two kinds of materials. Furthermore, in the fourth embodiment, there is explained the case where the second material is one kind of metal or alloy; alternatively, two or more kinds of materials having lower thermal conductivities than the first material identical to material of the heater plate 1 can be used as the second material.

Moreover, as a variation of the fourth embodiment, there can be embodied a shaft-equipped heater unit that includes a shaft part whose constituent material is composed of a first material having about the same coefficient of thermal expansion as material constituting the heater plate 1 and a second material having lower thermal conductivity than the material constituting the heater plate 1, wherein the shaft part is formed in such a manner that an end of the shaft part on the side in contact with the heater plate 1 is formed mainly of the first material having about the same coefficient of thermal expansion as the heater plate 1, and the proportion of the second material constituting the shaft part increases gradually from the side of the heater plate 1 to the other end.

The heater plate side of the shaft part is formed mainly of the first material having about the same coefficient of thermal expansion as material of the heater plate, and therefore, just like the fourth embodiment, the shaft-equipped heater unit according to the variation can suppress the accumulation of distortion due to a difference in thermal expansion between the heater plate 1 and the shaft part and the occurrence of interfacial delamination or crack, etc. Furthermore, the shaft part is formed so that the proportion of the second material having low thermal conductivity, which constitutes the shaft part, increases gradually from the side of the heater plate 1 to the other end, and therefore the heat conduction from the heater plate 1 to the shaft part can be reduced. Moreover, an end of the shaft part on the side not in contact with the heater plate 1 is formed of material having low thermal conductivity, and therefore an amount of heat conducted to an end of the shaft part on the side of a shaft body part can be reduced, and it is possible to prevent early deterioration of an O-ring used in the installation in the housing that contains the shaft-equipped heater unit.

INDUSTRIAL APPLICABILITY

The present invention is available in a shaft-equipped heater unit that performs precise temperature control of a heater plate and a method for manufacturing the shaft-equipped heater unit, and is useful especially in semiconductor manufacturing equipment.

REFERENCE SIGNS LIST

1 Heater plate
2, 2A, 2B Shaft part
3 Sheath heater
3a Power supply line
4 Shaft body part
5 Hollow portion
6 Heat insulation groove
7 Cover part
8 Cover support part
9 Cooling medium channel
10 Cooling pipe
11 Inflow port
12 Outflow port
13 Pipe
50, 50A Cold spray device
51 Gas introduction pipe
51a, 51b, 51c Valve
52 Powder supply unit
53 Heater
54 Chamber
55 Nozzle
100, 100A, 100B Shaft-equipped heater unit

The invention claimed is:

1. A shaft-equipped heater unit comprising:
a heater plate that heats an object to be heated placed thereon; and
a shaft that supports the heater plate,
wherein
the shaft is formed by spraying, on a rear surface of the heater plate, material powder which constitutes the shaft on the heater plate at a temperature lower than a melting point of the material powder by heated compressed gas, and
the material powder bites into the rear surface of the heater plate at an interface between the shaft and the rear surface of the heater plate.

2. The shaft-equipped heater unit according to claim 1, wherein
the heater plate is constituted of a metal or alloy having high thermal conductivity, and
the shaft is constituted of a metal or alloy having lower thermal conductivity than the material constituting the heater plate.

3. The shaft-equipped heater unit according to claim 1, wherein
the shaft comprises a heat-conduction suppressor that suppresses heat conduction from the heater plate to the shaft in a cylindrical body part thereof.

4. The shaft-equipped heater unit according to claim 3, wherein
the heat-conduction suppressor is a heat insulation groove.

5. The shaft-equipped heater unit according to claim 1, wherein
the shaft is formed of a first material identical to material constituting the heater plate and a second material having lower thermal conductivity than the material constituting the heater plate, and
an end of the shaft on the side in contact with the heater plate is formed of the first material as a main component, and proportion of the first material constituting the shaft decreases gradually from the end on the side of the heater plate to another end.

6. A shaft-equipped heater unit comprising:
a heater plate that heats an object to be heated placed thereon; and
a shaft that supports the heater plate, wherein
the shaft is formed by spraying material powder which constitutes the shaft on the heater plate at a temperature lower than a melting point of the material powder by heated compressed gas and
a cylindrical shaft body part of the shaft includes a cooling medium channel.

7. A method for manufacturing a shaft-equipped heater unit comprising a heater plate for heating an object to be heated placed thereon and a shaft for supporting the heater plate, the shaft-equipped heater unit manufacturing method comprising:
a shaft forming step of forming the shaft by spraying material powder, which constitutes the shaft, on the heater plate at a temperature lower than a melting point of the material powder by heated compressed gas.

8. The shaft-equipped heater unit manufacturing method according to claim 7, wherein
the shaft forming step comprises:
a first spraying step of spraying material powder, which constitutes the shaft, on the heater plate at a temperature lower than a melting point of the material powder by heated compressed gas;
a groove forming step of forming a heat insulation groove on the shaft formed at the first spraying step; and
a second spraying step of, after the groove forming step, further spraying material powder which constitutes the shaft on the shaft on which the heat insulation groove has been formed at a temperature lower than a melting point of the material powder by heated compressed gas.

9. The shaft-equipped heater unit manufacturing method according to claim 7, wherein
the shaft forming step comprises:
a first spraying step of spraying material powder, which constitutes the shaft, on the heater plate at a temperature lower than a melting point of the material powder by heated compressed gas;
a pipe placing step of placing a cooling medium pipe in the shaft formed at the first spraying step; and
a second spraying step of, after the pipe placing step, further spraying material powder which constitutes the shaft on the shaft in which the pipe has been placed at a temperature lower than a melting point of the material powder by heated compressed gas.

10. The shaft-equipped heater unit manufacturing method according to claim 7, wherein
the shaft is formed of a first material identical to material constituting the heater plate and a second material having lower thermal conductivity than the material constituting the heater plate, and
an end of the shaft on the side in contact with the heater plate is formed of the first material as a main component, and proportion of the first material constituting the shaft decreases gradually from the end on the side of the heater plate to another end.

* * * * *